United States Patent
Chu et al.

(10) Patent No.: US 6,743,651 B2
(45) Date of Patent: Jun. 1, 2004

(54) METHOD OF FORMING A SIGE-ON-INSULATOR SUBSTRATE USING SEPARATION BY IMPLANTATION OF OXYGEN

(75) Inventors: Jack O. Chu, Manhasset Hills, NY (US); Feng-Yi Huang, Hacienda Heights, CA (US); Steven J. Koester, Ossining, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/128,794

(22) Filed: Apr. 23, 2002

(65) Prior Publication Data

US 2003/0199126 A1 Oct. 23, 2003

(51) Int. Cl.$^7$ .................. H01L 21/00; H01L 21/84; H01L 21/331; H01L 21/31
(52) U.S. Cl. .................. 438/46; 438/47; 438/149; 438/235; 438/311; 438/312; 438/966; 438/967
(58) Field of Search .................. 438/46, 47, 149, 438/235, 312, 311, 966, 967; 257/94, 347

(56) References Cited

U.S. PATENT DOCUMENTS 5,847,419 A * 12/1998 Imai et al. .................. 257/192

6,602,613 B1 * 8/2003 Fitzgerald .................. 428/641

OTHER PUBLICATIONS

Ishikawa et al., SiGe–on–insulator substrte using SiGe alloy grown Si(001), Aug. 16, 1999, Applied Physics Letters, vol. 75, No. 7, pp. 983–985.*

Fukatsu S., SiGe–based semiconductor–on–insulator substrate created by low-energy separation–by–implanted–oxygen, Jun. 29, 1998, Applied Physics Letters, vol. 72, No 26, pp. 3485—3487.*

* cited by examiner

Primary Examiner—Long Pham
Assistant Examiner—Shrinivas H Rao
(74) Attorney, Agent, or Firm—Scully, Scott, Murphy & Presser; Robert M. Trepp, Esq.

(57) ABSTRACT

A method of fabricating high-quality, substantially relaxed SiGe-on-insulator substrate is provided by implanting oxygen into a Si/SiGe multilayer heterostructure which comprises alternating Si and SiGe layers. Specifically, the high quality, relaxed SiGe-on-insulator is formed by implanting oxygen ions into a multilayer heterostructure which includes alternating layers of Si and SiGe. Following, the implanting step, the multilayer heterostructure containing implanted oxygen ions is annealed, i.e., heated, so as to form a buried oxide region predominately within one of the Si layers of the multilayer structure.

30 Claims, 4 Drawing Sheets

METHOD OF FORMING A SIGE-ON-INSULATOR SUBSTRATE USING SEPARATION BY IMPLANTATION OF OXYGEN

FIELD OF THE INVENTION

The present invention relates to a method of fabricating a semiconductor substrate, and more particularly to a method of fabricating a substantially relaxed SiGe-on-insulator substrate material by implanting oxygen into a multilayer structure which includes alternating Si and SiGe layers.

BACKGROUND OF THE INVENTION

In the semiconductor industry, there has recently been a high-level of activity using SiGe-on-insulator materials as a substrate for strained Si-based heterostructures. As is well known, strained Si-based heterostructures achieve high mobility structures for complementary metal oxide semiconductor (CMOS) applications. In a typical prior art process, a thick strained Si layer (on the order of from about 1 to about 5 micrometers) is grown on a relaxed SiGe buffer layer. In some applications, the relaxed buffer layer is the top layer of a SiGe-on-insulator substrate material.

A typical prior art SiGe-on-insulator substrate is shown, for example, in FIG. 1. Specifically, the SiGe-on-insulator substrate illustrated in FIG. 1 comprises bottom Si substrate 10, insulating, i.e., buried oxide, region 12 present atop Si substrate 10, and relaxed SiGe layer 14 present atop insulating region 12. In such a structure, the insulating region electrically isolates the top relaxed SiGe layer from the bottom Si substrate.

In the prior art, SiGe-on-insulator substrates may be formed utilizing one of the following three techniques: (1) wafer bonding; (2) direct implantation of Ge into a silicon-on-insulator substrate (SOI); or (3) direct implantation of oxygen into SiGe layers followed by annealing. Although the above-identified prior art methods of fabricating SiGe-on-insulators have been successfully employed in the past, each of the aforementioned prior art processes have some problems associated therewith.

For example, in fabricating a SiGe-on-insulator substrate using bonding, there are no straightforward means of thinning the SiGe-on-insulator substrate once the layer has been transferred. With silicon-on-insulators (SOIs), the top Si layer can be thinned by oxidation and subsequent oxide removal. Such a technique, however, can create rough surfaces with SiGe layers due to the SiGe snowplowing effect. The Ge concentration in the SiGe layer increases as the thinning proceeds and when the Ge concentration is too high, e.g., >25–30%, high surface roughness typically results.

Direct implantation of Ge into SOI films has an advantage over bonding in that the buried oxide region is already created before formation of the SiGe layer. However, direct implantation of Ge into Si is likely to create a very large density of defects that will compromise the crystalline quality of the resulting SiGe-on-insulator.

The third known technique for forming SiGe-on-insulator substrates is by direct oxygen implantation into SiGe layers followed by a subsequent high temperature (on the order of 1000° C. or above) annealing step. The direct oxygen implantation and annealing into SiGe layers is, however, limited to using SiGe layers that have a Ge content of less than 15 atomic percent.

In view of the drawbacks mentioned hereinabove with prior art methods of fabricating SiGe-on-insulator substrates, there is a need for providing a new and improved method for fabricating SiGe-on-insulator substrates wherein the top layer of the substrate is comprised of a substantially relaxed SiGe layer which may have a thickness of about 1000 Å or less.

SUMMARY OF THE INVENTION

One object of the present invention is to provide a method of fabricating a substantially relaxed SiGe-on-insulator substrate material for use in CMOS applications.

A further object of the present invention is to provide a method of fabricating a substantially relaxed SiGe-on-insulator substrate which includes SiGe layers above the buried oxide region that have a high-crystalline quality and a thickness of about 1000 Å or less.

A further object of the present invention is to provide a method of fabricating a substantially relaxed SiGe-on-insulator substrate which includes a top SiGe layer that has a low defect density (on the order of about $1 \times E7$ defects/cm$^2$ or less) associated therewith.

Another object of the present invention is to provide a method of fabricating a substantially relaxed SiGe-on-insulator substrate which has a uniform composition in the insulating region and has a top SiGe layer which has a higher Ge content than that which can be obtained using prior art direct implantation of oxygen into SiGe layers.

These and other objects and advantages can be achieved in the present invention by implanting oxygen into a multilayer heterostructure that comprises alternating Si and SiGe layers. The inventive method positions the Si and SiGe layers of the multilayer structure in such a way so as to form a buried oxide layer in a region of the multilayer heterostructure containing predominately Si to facilitate the formation of a high-quality buried oxide region. Furthermore, a surface Si layer (referred to hereinafter as a Si capping layer) may be employed as a sacrificial layer for the formation of a surface oxide layer during the high-temperature annealing step needed to form the buried oxide.

In broad terms, the inventive method comprises the steps of:

implanting oxygen ions into a multilayer heterostructure comprising alternating layers of Si and SiGe, wherein said multilayer heterostructure has an uppermost layer of SiGe; and annealing said multilayer heterostructure containing implanted oxygen ions to form a buried oxide region predominately within one of the Si layers of the multilayer heterostructure.

It is noted that the present invention contemplates the formation of patterned as well as unpatterned buried oxide regions. The term "unpatterned buried oxide region" is used herein to denote a buried oxide region that is present uniformly and continuously throughout the entire relaxed SiGe-on-insulator substrate, whereas the term "patterned buried oxide region" denotes a buried oxide region that is present as discrete and isolated islands throughout the relaxed SiGe-on-insulator substrate.

In some embodiments of the present invention, a Si capping layer may be formed atop the uppermost SiGe layer of the multilayer structure. When such an embodiment is employed, the Si capping layer serves as a sacrificial layer for the formation of a surface oxide layer that forms during the annealing step. The Si capping layer may be formed prior to, or after the implant step of the present invention.

BRIEF DESCRIPTION OF THE DRAWINGS

FIG. 5A prior to oxygen implantation; and FIG. 5B after oxygen ion implantation.

DETAILED DESCRIPTION OF THE INVENTION

Figure 1A:
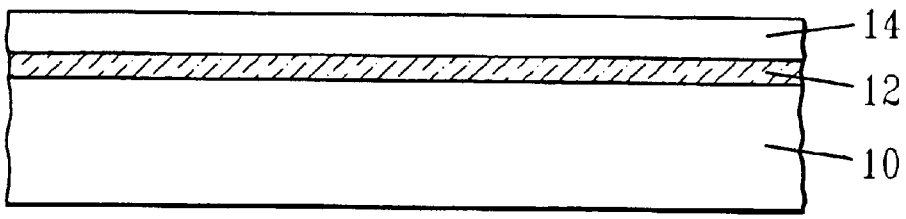
FIG. 1 is a pictorial representation (through a cross-sectional view) showing a prior art SiGe-on-insulator substrate that may be formed by bonding, direct implantation of Ge into an SOI substrate, or direct oxygen implantation of Ge into SiGe layers, followed by high-temperature annealing.

The present invention, which provides a method of fabricating high-quality, substantially relaxed SiGe-on-insulator substrates by direct oxygen implantation and annealing into a Si/SiGe heterostructure, will now be described in more detail by referring to the drawings that accompany the present application.

As stated above, the present invention relates to a method of forming high-quality, substantially relaxed SiGe-on-insulator substrates by directly implanting oxygen ions into a Si/SiGe multilayer heterostructure, and thereafter annealing the implanted Si/SiGe multilayer heterostructure so as to form a buried oxide region therein.

Figure 2A:
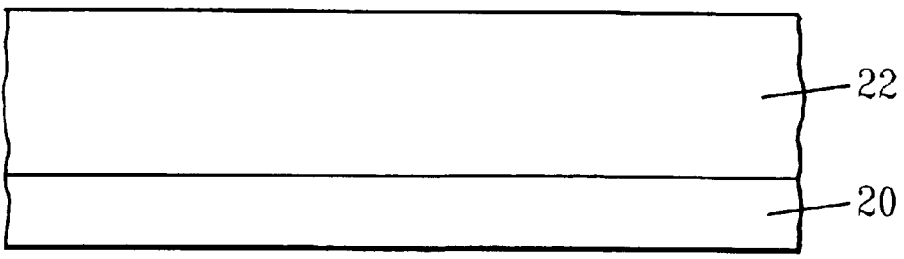
FIGS. 2A–2B are pictorial representations (through cross-sectional views) showing exemplary types of multilayer heterostructures that can be employed in the present invention.
Figure 2B:
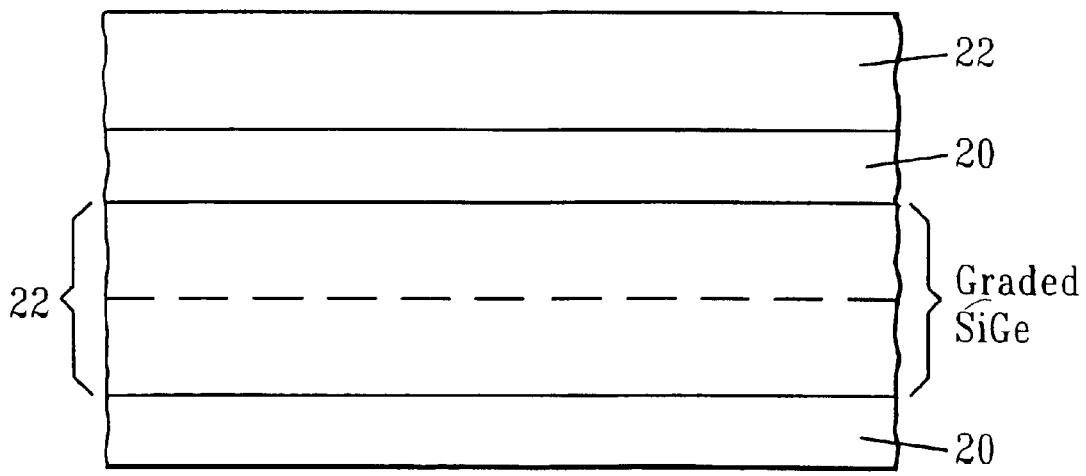

Reference is first to made to FIGS. 2A–2B which illustrate exemplary types of Si/SiGe multilayer heterostructures that can be employed in the present invention. The term "Si/SiGe multilayer heterostructure" is used herein to denote a heterostructure that comprises alternating layers of Si (labeled as 20) and SiGe (labeled as 22). Note that the uppermost layer of the multilayer heterostructure is comprised of a SiGe layer. Each SiGe layer 22 of the initial Si/SiGe multilayer heterostructure may be graded layer (as shown in FIG. 2B) or an ungraded layer (as is shown in FIG. 2A). The graded SiGe layers may have different atomic percents of Si and Ge present therein.

In accordance with the present invention, Si layers 20 of the multilayer heterostructure comprise single crystal Si, doped or undoped with n or p-type dopants, or doped with impurities such as, C, N, etc; epitaxial Si (i.e., epi-Si); or any combination thereof including multilayers doped and undoped in the above described manner. The thickness of each individual Si layer of the multilayer heterostructure may vary depending upon the type of Si layer employed as well as the method that is used in forming the same. Typically, however, the thickness of each individual Si layer is from about 1 to about 1000 nm, with a thickness of from about 20 to about 200 nm being more highly preferred. Each individual SiGe layer of the multilayer Si/SiGe heterostructure may also have a variable thickness, but typically, each SiGe layer has a thickness of from about 1 to about 1000, preferably from about 20 to about 100, nm. It is noted that in the case of more than one Si layer and more than one SiGe layer each of the Si and SiGe layers may have the same or different thicknesses.

The multilayer heterostructure of the present invention may contain any number of Si and SiGe layers provided that it comprises at least one Si base layer and a SiGe layer formed atop said Si base layer. The multilayer heterostructures shown in FIGS. 2A–2B are formed utilizing conventional processes well known in the art. For example, the Si layers of the multilayer heterostructures are formed by a conventional deposition process including, but not limited to: chemical vapor deposition (CVD), plasma-enhanced CVD, epitaxial growth, and other like deposition processes which are capable of forming a Si layer. The SiGe layers, which are crystalline, are formed utilizing any conventional epitaxial growing process including, but are not limited to: low-pressure chemical vapor deposition (LPCVD), ultra-high vacuum chemical vapor deposition (UHVCVD), molecular beam (MBE) epitaxy, plasma-enhanced chemical vapor deposition (PECVD), rapid thermal CVD (RTCVD), and a low-energy plasma process (LEPP).

The SiGe layers that are formed by epitaxial growing are substantially free of defect densities and the SiGe layers have a relaxed characteristic as compared to the Si layers. In particularly, each SiGe layer of the heterostructure has a defect density of about 1E7 defects/cm$^2$ or less and a determined relaxation value of about 0–100%.

As mentioned above, the SiGe layers may be a single SiGe layer having a uniform composition, or alternatively graded SiGe layers having different atomic percents of Si and Ge may be employed. Notwithstanding the type of SiGe layer employed, the SiGe layers of the present invention have an atomic percent of Ge of about 1% or higher, with an atomic percent of Ge of from about 5 to about 30% being more highly preferred.

The presence of at least one buried Si layer in the heterostructure of the present invention allows for the formation of an improved buried oxide (BOX) region, as well as for the preservation of more Ge in the SOI layer during buried oxide formation as compared to the prior art case wherein oxygen is directly implanted into SiGe layers. This provides a significant advantage over the prior art oxygen implantation process because the use of a Si/SiGe heterostructure improves the ability to form a continuous BOX.

Figure 3A:
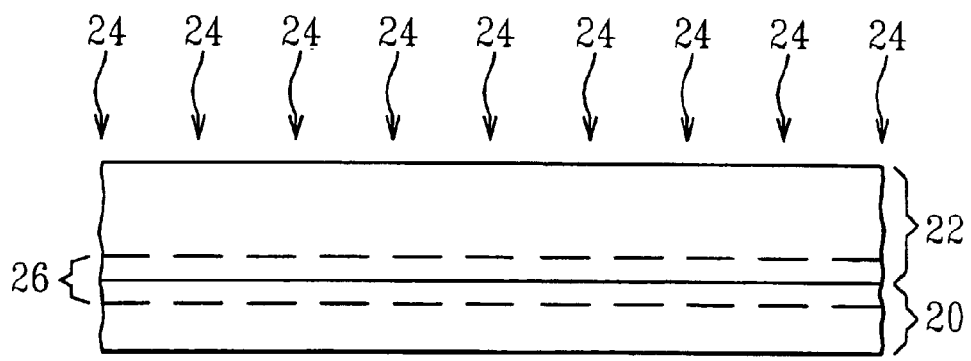
FIGS. 3A–3B are pictorial representations (through cross-sectional views) showing implanted oxygen regions that are formed by the implanting step of the present invention in the multilayer heterostructures of FIGS. 2A and 2B, respectively.
Figure 3B:
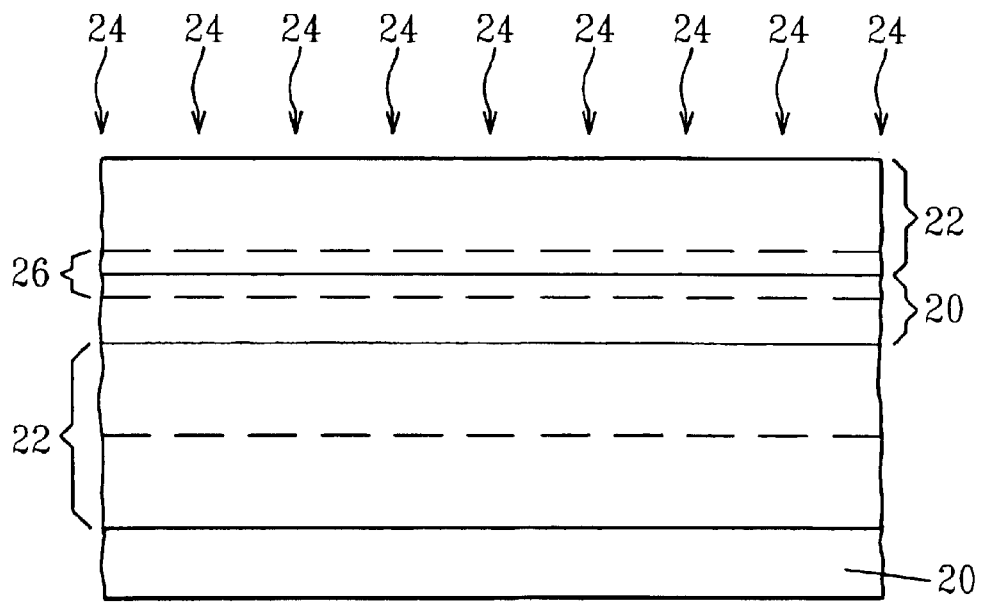

Next, and as shown in FIGS. 3A–3B, oxygen ions (represented by reference numeral 24) are incorporated into the initial Si/SiGe multilayer heterostructure so as to form implant oxygen region 26 predominately within at least one of the Si layers of the heterostructure. Specifically, the oxygen ions are incorporated into the Si/SiGe heterostructure using any conventional oxygen ion implantation process, i.e., SIMOX (separation by ion implantation of oxygen) that is typically employed in forming a buried oxide region with a Si substrate. For example, the ion implantation conditions described in co-assigned U.S. patent application Ser. Nos. 09/861,593, filed May 21, 2001; 09/861,594, filed May 21, 2001; 09/861,590, filed May 21, 2001; 09/861,596, filed May 21, 2001; and 09/884,670, filed Jun. 19, 2001 as well as U.S. Pat. No. 5,930,634 to Sadana, et al., the entire contents of each are incorporated herein by reference may be employed herein.

Although conventional ion implants can be employed in the present invention, the following description provides some more details of the different types of oxygen ion implantation steps that may be employed in the present invention.

I. High-dose oxygen ion implantation: The term "high-dose" as used herein denotes an oxygen ion dosage of about $4E17$ cm$^{-2}$ or greater, with an oxygen ion dosage of from about $4E17$ to about $2E18$ cm$^{-2}$ being more preferred. In addition to using high-oxygen dosage, this implant is typically carried out in an ion implantation apparatus at an energy of from about 10 to about 1000 keV. More preferably, this implant is carried out using an energy of from about 60 to about 250 keV.

This implant, which may be referred to as a base ion implant, is carried out at a temperature of from about 200° to about 800° C. at a beam current density of from about 0.05 to about 500 mA cm$^{-2}$. More preferably, the base ion implant may be carried out at a temperature of from about 200° to about 600° C. at a beam current density of from about 4 to about 8 mA cm$^{-2}$.

If desired, the base oxygen implant step may be followed by a second oxygen implant that is carried out using an oxygen dose of from about $1E14$ to about $1E16$ cm$^{-2}$, with an oxygen dose of from about $1E15$ to about $4E15$ cm$^{-2}$ being more highly preferred. The second oxygen implant is carried out at an energy of from about 40 keV or greater, with an energy of from about 120 to about 450 keV being more preferred.

This second implant is performed at a temperature of from about 4K to about 200° C. with a beam current density of from about 0.05 to about 10 mA cm$^{-2}$. More preferably, the second oxygen implant may be performed at a temperature of from about 25° to about 100° C. with a beam current density of from about 0.5 to about 5.0 mA cm$^{-2}$.

Note that the second oxygen implant forms an amorphous region below the damaged region caused by the base ion implant step. During the subsequent annealing, the amorphous and damaged region are converted into a buried oxide (i.e., BOX) region.

II. Low-dose oxygen implant: The term "low-dose" as used herein for this embodiment of the present invention denotes an oxygen ion dose of about $4E17$ cm$^{-2}$ or less, with an oxygen ion dose of from about $1E17$ to about $3.9E17$ cm$^{-2}$ being more preferred. This low-dose implant is performed at an energy of from about 40 to about 500 keV, with an implant energy of from about 60 to about 250 keV being more highly preferred.

This low-dose implant, which may be referred to as a base ion implant, is carried out at a temperature of from about 100° to about 800° C. More preferably, the base ion implant may be carried out at a temperature of from about 200° to about 650° C. The beam current density used in the low-dose implant is from about 0.05 to about 500 mA cm$^{-2}$.

If desired, the base low-dose oxygen implant step may be followed by a second oxygen implant that is carried out using the conditions mentioned above.

It is again emphasized that the above types of oxygen ion implantations are exemplary and by no way limit the scope of the present invention. Instead, the present invention contemplates all conventional oxygen ion implants that are typical employed in conventional SIMOX processes.

Following the direct ion implantation of oxygen into the heterostructure, the implanted structure shown, for example, in FIGS. 3A–3B, is then subjected to an annealing step which is capable of forming buried oxide region 28 predominately within one of the Si layers of the multilayer heterostructure.

Specifically, the annealing step of the present invention is performed at a temperature of from about 1000° to about 1375° C., with a temperature of from about 1150° to about 1325° C. being more highly preferred. Moreover, the annealing step of the present invention is carried out in an oxidizing or non-oxidizing ambient. When an oxidizing ambient is employed, the oxidizing ambient includes at least one oxygen-containing gas such as $O_2$, NO, $N_2O$, ozone, air as well as other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. In some embodiments, the oxidizing ambient may be admixed with a chlorine-containing gas or liquid mixture which serves as a metal gettering agent and a means to adjust Ge concentration in the substrates. The oxidizing/chlorine-containing admixture may also include an inert gas.

When a non-oxidizing ambient is employed in the annealing step of the present invention, at least one of the above-mentioned inert gases may be employed.

The annealing step may be carried out for a variable period of time, which typically ranges from about 1 to about 100 hours, with a time period of from about 2 to about 24 hours being more highly preferred. The annealing step may be carried out at a single targeted temperature, or various ramp and soak cycles using various ramp rates and soak times can be employed.

Note that during the annealing step, a surface oxide layer (not shown) may be formed atop the uppermost SiGe layer when an oxidizing ambient is used during annealing. In some embodiments, the surface oxide layer is removed after the annealing step using a conventional chemical etching process that is highly selective for removing oxide as compared with SiGe.

Figure 4A:
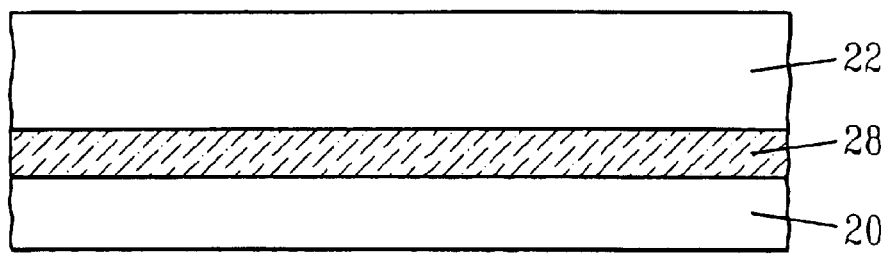
FIGS. 4A–4B are pictorial representations (through cross-sectional views) showing buried oxide regions that are formed after performing the annealing step of the present invention on the structures of FIGS. 3A and 3B, respectively.
Figure 4B:
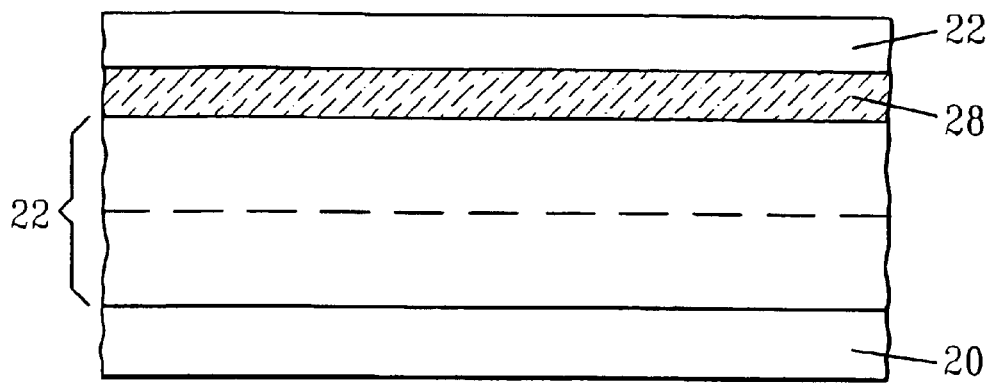

The resultant structure obtained after annealing (and subsequent removal or the surface oxide layer) is shown, for example, in FIGS. 4A–4B. In these figures, reference numeral 20 denotes Si layers, reference numeral 22 denotes relaxed SiGe layers, and reference numeral 28 denotes buried oxide. Note that during the inventive process, the SiGe layers above the buried oxide region including the uppermost SiGe layer are thinned somewhat from their initial thickness. For example, after implanting and annealing, the SiGe layers above the buried oxide region may have a thickness of about 1000 Å or less, with a thickness of from about 100 to about 500 Å being more highly preferred. The thickness of the resultant buried oxide region formed in the present invention may vary, but typically buried oxide region 28 has a thickness of from about 30 to about 200 nm.

In addition to being thinned, it is important to note that the SiGe layers of the heterostructure above the buried oxide region including the uppermost SiGe layer maintain most of their Ge content since the Ge remains confined between the surface oxide and the BOX during annealing in the present invention.

Figure 5A:
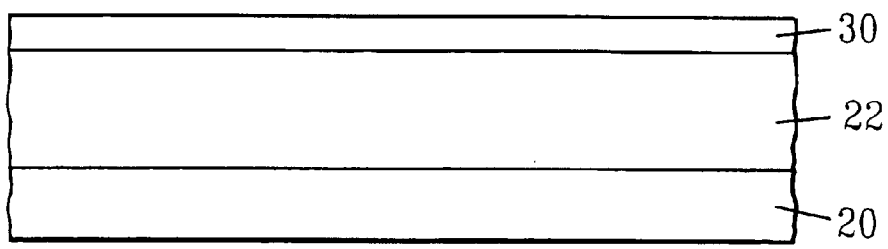
FIGS. 5A–5B are pictorial representations (through cross-sectional views) showing an alternative embodiment of the present invention wherein a Si capping layer is formed atop the multilayer heterostructure of FIG. 2A.

Reference is now made to FIG. 5A which is a pictorial representation (through cross-sectional view) showing an alternative embodiment of the present invention wherein Si capping layer 30 is formed atop the multilayer Si/SiGe heterostructure of FIG. 2A. Note that although reference is made to the structure shown in FIG. 2A, this alternative embodiment of the present invention is not limited to just that structure. Instead, the alternative embodiment can be used with any Si/SiGe heterostructure.

The Si capping layer, which is formed using any conventional deposition process, is composed of one of the above mentioned Si materials, as well as poly Si, and amorphous Si. The Si capping layer may also include any combination of the aforementioned Si layers including multilayers. The thickness of the Si capping layer employed in the present invention may vary, but typically Si capping layer 30 has a thickness of from about 1 to about 50 nm. More preferably, Si capping layer 30 has a thickness of from about 10 to about 30 nm. Following the formation of the Si capping layer atop the Si/SiGe multilayer structure the inventive processing steps of the present invention may then be performed.

Figure 5B:
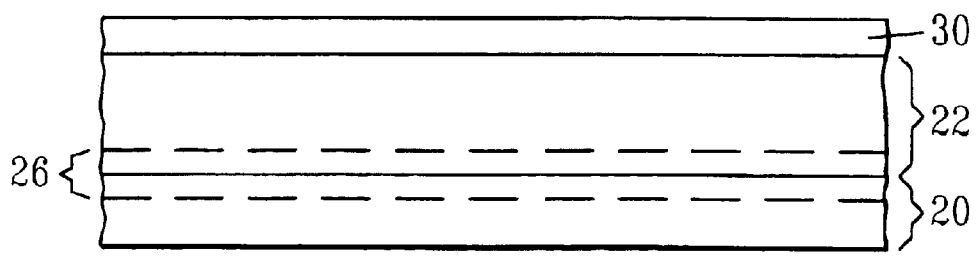

In addition to forming the Si capping layer on the Si/SiGe heterostructure prior to oxygen ion implantation, Si capping layer 30 may be formed atop a Si/SiGe heterostructure after the oxygen ions have been implanted into the structure, See FIG. 5B.

Figure 6A:
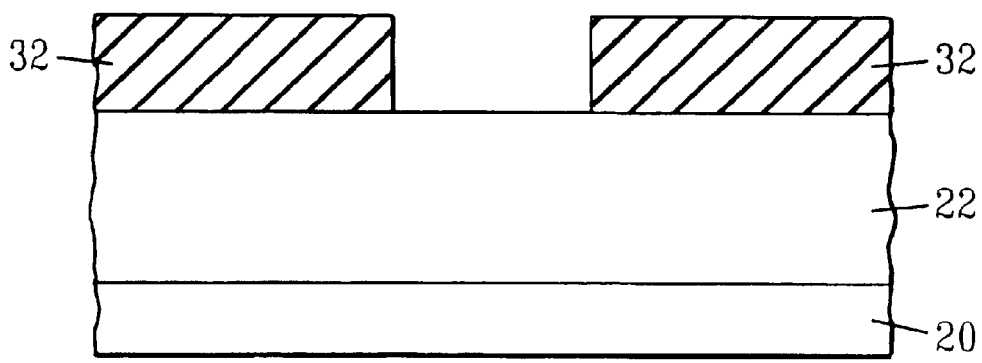
FIGS. 6A–6C are pictorial representations (through cross-sectional views) showing an alternative embodiment of the present invention wherein a patterned buried oxide layer is formed.
Figure 6B:
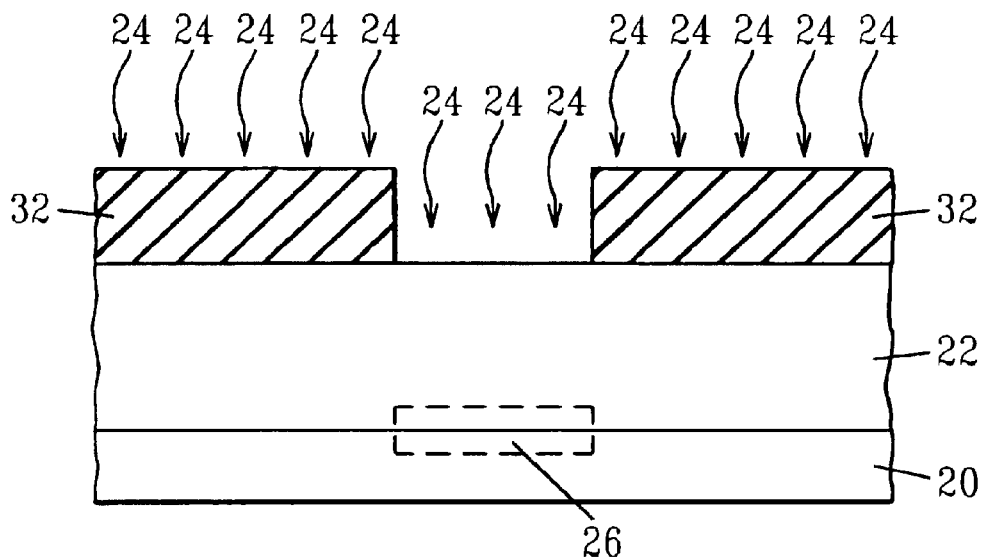
Figure 6C:
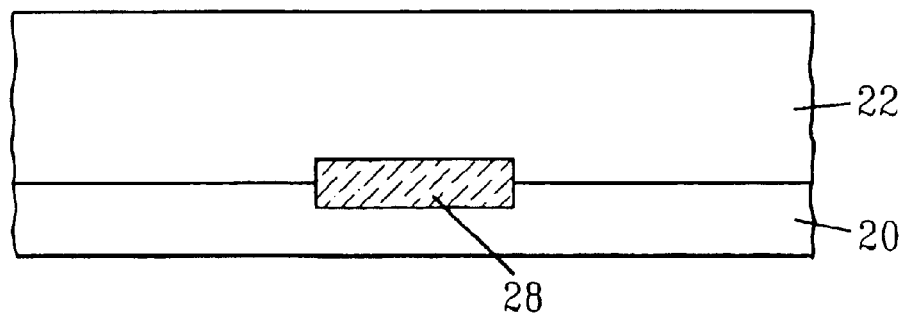

FIGS. 6A–6C are pictorial representations (through cross-sectional views) showing an alternative embodiment of the present invention wherein a patterned buried oxide layer is formed. Reference is first made to FIG. 6A which shows patterned dielectric hardmask 32, e.g., $Si_3N_4$, formed atop a surface of a Si/SiGe heterostructure. The structure shown in FIG. 6A is obtained by providing a conventional dielectric material to the surface of the heterostructure, patterning the dielectric material using conventional lithography including the steps of: applying a resist to the dielectric material, exposing the resist to a pattern of radiation, developing the exposed resist, transferring the pattern to the dielectric material via an etching process and removing the exposed resist from the structure.

After these steps, the structure including the patterned dielectric mask blocking portions of the heterostructure is subjected to the inventive method of the present invention. FIG. 6B shows the structure during oxygen ion implanting; and FIG. 6C shows the structure after annealing.

In some embodiments of the present invention, the dielectric mask is formed atop a Si capping layer that is formed atop the Si/SiGe multilayer heterostructure. In yet another embodiment, the Si capping layer is formed the exposed surfaces of the Si/SiGe heterostructure which are not protected by the patterned dielectric mask.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a relaxed SiGe-on-insulator substrate comprising the steps of:
   forming a patterned dielectric mask on a multilayer heterostructure comprising alternating layers of Si and SiGe, wherein said multilayer heterostructure has an uppermost layer of SiGe;
   implanting oxygen ions into said multilayer heterostructure not protected with the patterned dielectric mask; and
   annealing said multilayer heterostructure containing implanted oxygen ions to form discrete and isolated buried oxide regions in said heterostructure.

2. The method of claim 1 wherein said multilayer heterostructure comprises at least a Si base layer and an uppermost layer of SiGe.

3. The method of claim 1 wherein said Si layers of said multilayer heterostructure are selected from the group consisting of undoped single crystal Si, doped single crystal Si, epitaxial Si, and any combination or multilayer thereof.

4. The method of claim 1 wherein said Si layers of said multilayer heterostructure are formed by a deposition process selected from the group consisting of chemical vapor deposition, plasma-enhanced chemical vapor deposition and epitaxial growth.

5. The method of claim 1 wherein said SiGe layers of said multilayer heterostructure are graded or ungraded.

6. The method of claim 1 wherein said SiGe layers of said multilayer heterostructure are formed by an epitaxy growing process selected from the group consisting of low-pressure chemical vapor deposition, ultra-high vacuum chemical vapor deposition, molecular beam epitaxy, plasma-enhanced chemical vapor deposition, rapid thermal chemical vapor deposition, and a low-energy plasma process.

7. The method of claim 1 wherein said Si layers each have the same or different thickness which is from about 1 to about 1000 nm.

8. The method of claim 1 wherein said SiGe layers each have the same or different thickness which is from about 1 to about 1000 nm.

9. The method of claim 1 wherein said SiGe layers are crystalline and relaxed.

10. The method of claim 1 wherein said SiGe layers have a defect density of about 1E7 defects/cm$^2$ or less and a measured relaxation value of about 0 to 100%.

11. The method of claim 1 wherein said SiGe layers have a Ge content of about 1 atomic percent or higher.

12. The method of claim 11 wherein said SiGe layers have a Ge content of from about 5 to about 30 atomic percent.

13. The method of claim 1 wherein said implanting step is performed using a separation by ion implantation of oxygen (SIMOX) process.

14. The method of claim 13 wherein said SIMOX process is an ion implantation process selected from the group consisting of high-dose oxygen ion implantation and low-dose oxygen implantation.

15. The method of claim 1 wherein said implanting step is carried out using a high-dose oxygen ion implantation process wherein an ion dose of about 4E17 cm$^{-2}$ or greater is employed.

16. The method of claim 1 wherein said implanting step is carried out using a low-dose oxygen ion implantation process wherein an ion dose of about 4E17 cm$^{-2}$ or less is employed.

17. The method of claim 1 wherein a Si capping layer is formed on said uppermost SiGe layer of said multilayer heterostructure either before or after said implanting is performed.

18. The method of claim 17 wherein said Si capping layer (comprises) is selected from the group consisting of polycrystalline silicon, epitaxial silicon, amorphous silicon, undoped or doped single crystal Si or any combination and multiplayer thereof.

19. The method of claim 18 wherein said Si capping layer has a thickness of from about 1 to about 50 nm.

20. The method of claim 1 wherein said annealing step is performed at a temperature of from about 1000° to about 1375° C.

21. The method of claim 1 wherein said annealing step is carried out in a non-oxidizing ambient.

22. The method of claim 1 wherein said annealing step is carried out in an oxidizing ambient.

23. The method of claim 22 wherein said oxidizing ambient comprising at least one oxygen-containing gas which may optionally be admixed with an inert gas, a chlorine-containing gas or liquid or a combination of inert gas and chlorine-containing gas or liquid.

24. The method of claim 23 wherein said at least one oxygen-containing gas comprises $O_2$, NO, $NO_2O$, ozone or air.

25. The method of claim 1 wherein said annealing step is carried out for a time period of from about 1 to about 100 hours.

26. The method of claim 1 wherein said uppermost SiGe layer of said multilayer heterostructure has a thickness, after annealing, of about 1000 Å or less.

27. The method of claim 1 wherein said buried oxide layers has a thickness of from about 30 to about 200 nm.

28. The method of claim 1 wherein SiGe layers above said buried oxide layer maintain their initial Ge content.

29. The method of claim 1 wherein a Si capping layer is formed on exposed surfaces of said heterostructure not containing said patterned dielectric mask.

30. A method of fabricating a relaxed SiGe-on-insulator substrate comprising the steps of:

forming a Si capping layer on a multilayer heterostructure comprising alternating layers of Si and SiGe, wherein said multilayer heterostructure has an uppermost layer of SiGe;

forming a patterned dielectric mask on said Si capping layer;

implanting oxygen ions into said multilayer heterostructure not protected with the patterned dielectric mask; and annealing said multilayer heterostructure containing implanted oxygen ions to form discrete and isolated buried oxide regions in said heterostructure.

* * * * *

UNITED STATES PATENT AND TRADEMARK OFFICE
CERTIFICATE OF CORRECTION

PATENT NO. : 6,743,651 B2
DATED : June 1, 2004
INVENTOR(S) : Jack O. Chu et al.

It is certified that error appears in the above-identified patent and that said Letters Patent is hereby corrected as shown below:

Title page,
Item [56], References Cited, OTHER PUBLICATIONS,
"Ishikawa et al.," reference, "substrte" should read -- substrate --

Column 8,
Line 38, "4B17" should read -- 4E17 --

Signed and Sealed this

Fifth Day of April, 2005

JON W. DUDAS
*Director of the United States Patent and Trademark Office*